United States Patent
Katsap (10) Patent No.: US 11,699,564 B2
(45) Date of Patent: Jul. 11, 2023

(54) SCHOTTKY THERMAL FIELD EMITTER WITH INTEGRATED BEAM SPLITTER

(71) Applicants: NuFlare Technology, Inc., Kanagawa (JP); NuFlare Technology America, Inc., Sunnyvale, CA (US)

(72) Inventor: Victor Katsap, Hopewell Junction, NY (US)

(73) Assignees: NuFlare Technology, Inc., Kanagawa (JP); NuFlare Technology America, Inc., Sunnyvale, CA (US)

( * ) Notice: Subject to any disclaimer, the term of this patent is extended or adjusted under 35 U.S.C. 154(b) by 448 days.

(21) Appl. No.: 17/078,681

(22) Filed: Oct. 23, 2020

(65) Prior Publication Data

US 2022/0130633 A1 Apr. 28, 2022

(51) Int. Cl.
H01J 37/073 (2006.01)
H01J 37/063 (2006.01)
H01J 37/12 (2006.01)

(52) U.S. Cl.
CPC .......... *H01J 37/073* (2013.01); *H01J 37/063* (2013.01); *H01J 37/12* (2013.01)

(58) Field of Classification Search
CPC ................... H01J 37/073; H01J 37/063; H01J 2237/06316
See application file for complete search history.

(56) References Cited

U.S. PATENT DOCUMENTS

| 9,035,249 | B1 * | 5/2015 | Frosien | H01J 37/244 |
|---|---|---|---|---|
| | | | | 250/311 |
| 9,673,016 | B2 * | 6/2017 | Kim | H01J 37/065 |
| 2014/0224985 | A1 | 8/2014 | Rodgers et al. | |
| 2022/0367140 | A1 * | 11/2022 | Jiang | H01J 37/09 |

FOREIGN PATENT DOCUMENTS

KR 10-2019-0138898 A1 12/2019

OTHER PUBLICATIONS

Taiwanese Office Action dated Nov. 7, 2022 in Taiwanese Patent Application No. 110133827 (with unedited computer generated English Translation), 7 pages.
Korean Office Action dated Mar. 11, 2023, in Korean Patent Application No. 10-2021-0095459 filed Jul. 21, 2021, (with English Translation, total 9 pages).

* cited by examiner

*Primary Examiner* — Joseph L Williams
(74) *Attorney, Agent, or Firm* — Oblon, McClelland, Maier & Neustadt, L.L.P.

(57) ABSTRACT

A Schottky thermal field emitter (TFE) source integrated with a beam splitter by a standoff, which supports the beam splitter above the Schottky TFE extractor faceplate by a distance of 0.05 mm to 2 mm. The beam splitter includes a microhole array integrated with the standoff and being disposed opposite the extractor faceplate, the microhole array having a plurality of microholes that split the electron beam generated by the Schottky TFE into a plurality of beamlets. The support and extractor may be fabricated from the same material or from different materials. The support may be formed from a high temperature resistive material, which causes a potential difference between the extractor and the microhole array. This potential difference creates positively charged electrostatic lenses at the microholes, which increases current in the individual beamlets. Voltage on the microarray plate may be varied to achieve a high beamlet current.

20 Claims, 8 Drawing Sheets

SCHOTTKY THERMAL FIELD EMITTER WITH INTEGRATED BEAM SPLITTER

BACKGROUND

Field

This disclosure generally relates to a Schottky thermal field emitter (TFE) extractor integrated with a beam splitter microhole array by a standoff, which supports the beam splitter microhole array above, and in close proximity to, the extractor.

Description of the Related Art

A scanning electron microscope (SEM) requires a field emission gun (FEG), which generates an electron beam used to strike a target material. The FEG may include a Schottky TFE emitter as the electron beam source.

Early SEMs provided only a single electron beam. As each beam could scan only a small target area, raster scanning a single target required many hours/days.

Attempts have been made to employ multiple beams, or beamlets. Previous efforts included using stand-alone beam splitter as an array of multiple holes in solid foil, and placing this stand-alone beam splitter somewhere away from the source of thermal field emission, such as either inside the FEG or outside it in an electron optical column.

Limitations of these designs include, but are not limited to, the following:

(1) The large pre-split beam current must travel long distances before reaching splitter, which gives rise to unwanted global and stochastic space charge effects, causing broadening of electron's energy spread and displacement of the trajectories, which in turn causes beamlet blur and defocusing.

(2) Strongly diverging beams emitted by the Schottky TFE allow for only small number of electrons to pass thru individual holes in a remote stand-alone beam splitter, thus the total current of each split beam (beamlet) is very small.

A Schottky TFE source consists of a single-crystal tungsten wire with a very sharp tip equipped with a zirconium reservoir around the tungsten wire. The tip is mounted on a hairpin filament, which is used to maintain the tip at a temperature of 1750 K to 1850 K. This assembly is mounted onto a ceramic base and two electrodes are added. The first electrode is a suppressor having an aperture surrounding the tungsten wire. The second electrode is an extractor having an aperture just above the tip of the wire. The tip protrudes through the suppressor aperture and faces the extractor, which may be considered as an anode in a classical triode gun comprised of the Schottky tip, suppressor and extractor. Electrons are emitted from the tip due to both thermal excitation and the electrical field at the tip. The tip radius typically ranges from 0.3 microns to 1.0 microns. The extractor central bore is typically 0.5 microns from the tip.

As the electron beam is emitted from the Schottky TFE, the beam spreads out due to the extractor lensing effect, the thermal velocity of the electrons and the Boersch effect. The Boersch effect refers to stochastic coulomb interactions between the electrons which increase the energy spread of the electrons, giving rise to an increase of chromatic aberration and trajectories displacement.

The FEG holds the Schottky TFE and has additional electrodes for shaping and aligning the beam. The function of these electrons is to focus the beam onto the FEG exit aperture, also known as the differential pumping aperture. The interior of the FEG is under vacuum, with pressure typically below $4 \times 10^{-9}$ Torr as required for Schottky operation.

However, a single TFE can deliver only a single, narrow beam to the target. Conventional solutions include splitting the electron beam with a beam splitter located at some point after the cathode electrodes and before the exit aperture of the FEG.

Figure 1:
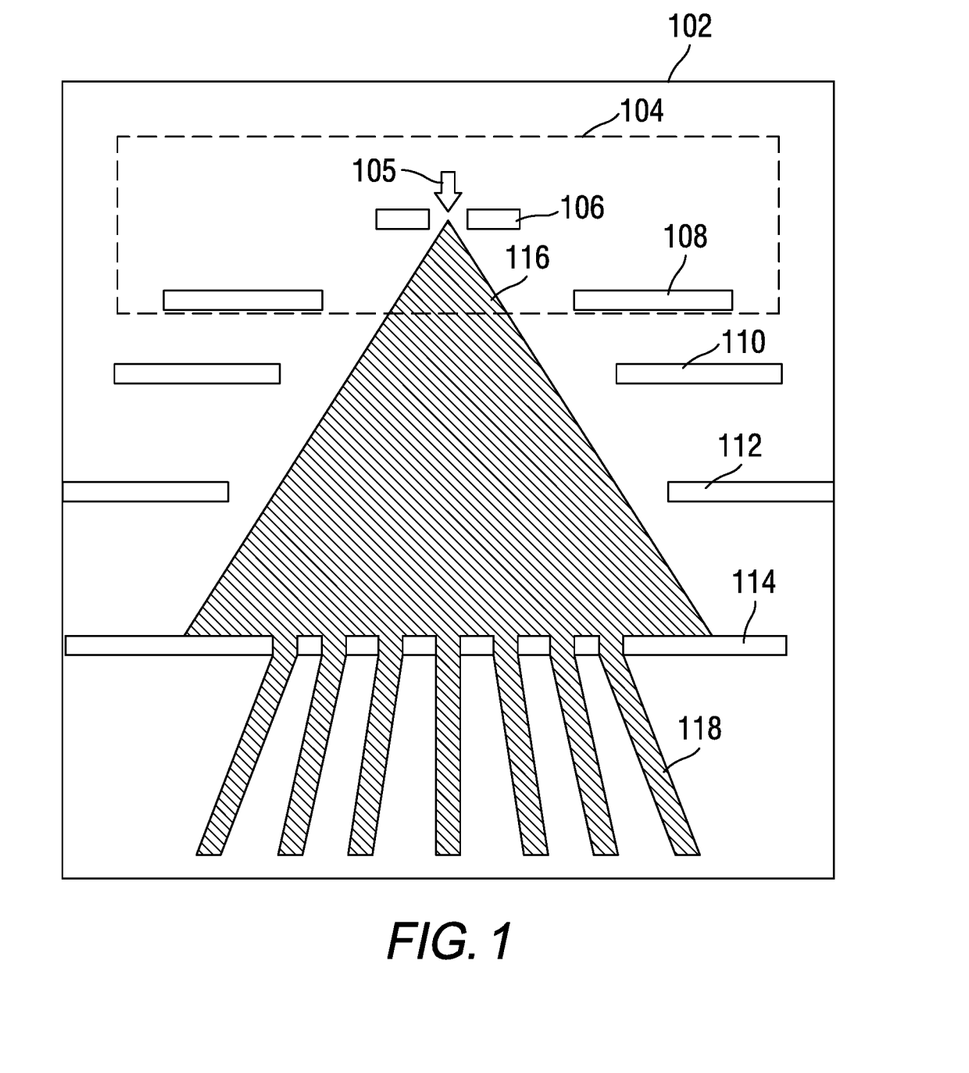
FIG. 1 is a schematic that shows a Schottky TFE, which includes an internal beam splitter.

Attempts have been made to include a beam splitter within the FEG. FIG. 1 is a schematic that shows a beam splitter 114 located inside of an FEG 102 but at a distance from the Schottky TFE 104 and the extractor faceplate 108. FEG 102 holds the Schottky TFE 104 within a vacuum. The vacuum at the FEG side of the is on the order of $10^{-9}$ Torr. The tip 105 is located behind the extractor 108. As the tip 105 releases electrons, the electrons are drawn towards the extractor by the potential on the extractor. In a non-limiting example, the extractor voltage may be on the order of 2 kV to 7 kV. The top surface of the extractor is the faceplate of the TFE. The electron beam 116 is shaped by the electrodes 108, 110 and 112 to focus the electron beam on the beam splitter 114. The split beams 118 (beamlets) exit the beam splitter and are focused by underlying optics onto the target (not shown in FIG. 1). At the target, instead of a single beam, the split beams 118 (beamlets) are able to simultaneously scan a larger area of the target than a single beam. However, in this approach, the current density of the beam passing thru beam splitter is small, as the energy spread and trajectory displacement of the pre-split electron beam 116 are high due to space charge effects over the large distance in which the pre-split beam travels from the extractor to the beam splitter. Additionally, the high vacuum is difficult to maintain, which makes the manufacture of a multi-electrode device costly.

Figure 2:
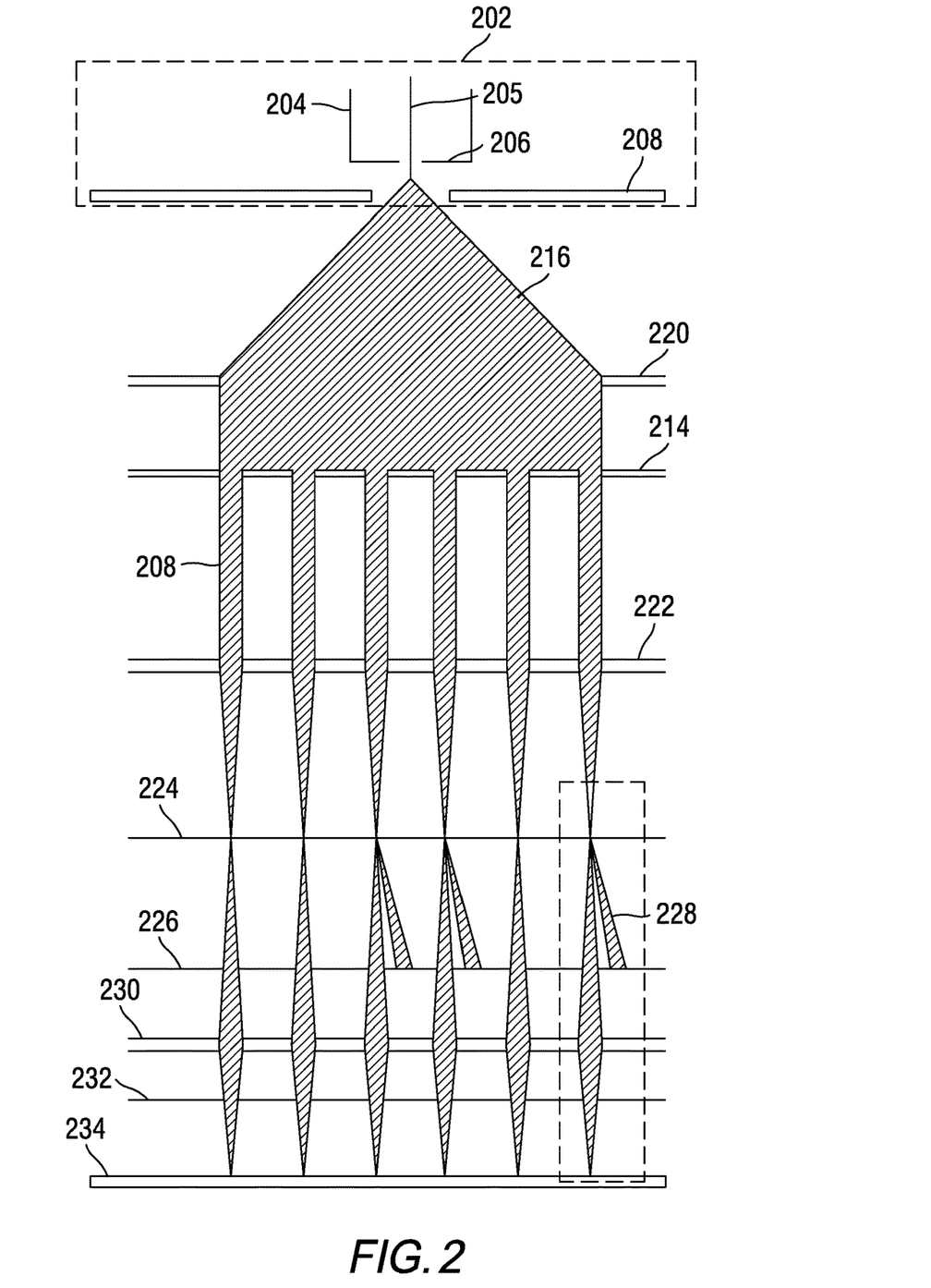
FIG. 2 is a schematic that shows a beam splitter supported above the extractor faceplate of a Schottky TFE.

Another conventional solution is to locate the beam splitter outside of the FEG, somewhere in the optical column. FIG. 2 is a schematic that shows the FEG 202 including the Schottky TFE 204 having a tip 205, an aperture plate 206, and an extractor 208. The electron beam 216 spreads until it reaches collimator lens 220. The collimated beam then passes through the beam splitter 214 to form split beams 218. A condenser lens 222, blanker aperture 224, beam stop 226, and projection lens 230 focus the split beams 218 (beamlets) onto the target 234. The beam stop 226 removes the excess spread of each split beam 218, as these divergent beams can cause noise at the target. However, the split beams 218 at the target in the conventional solution of FIG. 2 have low current due to the pre-split beam large diameter at the beam splitter 222.

Each of the aforementioned structures suffers from one or more drawbacks hindering their adoption. Accordingly, it is one object of the present disclosure to provide methods and systems for a beam splitter integrated with the Schottky TFE to split the electron beam before the beam widely diverges, thus keeping the current of each split beam high and diminishing space charge effects by separating the beams very close to their origination point (the Schottky tip), thus preventing long-distance travel of the pre-split high current beam.

SUMMARY

Embodiments of the present disclosure describe the integration of a Schottky thermal field emission (TFE) with a beam splitter having an array of microholes. The beam splitter is supported above and in close proximity to the extractor faceplate of the Schottky TFE by a standoff integrated with the extractor faceplate.

A first embodiment describes a beam splitter integrated with a thermal field emission (TFE) source comprising a Schottky TFE having an extractor faceplate, a standoff integrated with the extractor faceplate, and a microhole array integrated with the standoff and being disposed opposite the extractor faceplate, the microhole array having a plurality of microholes.

A second embodiment describes a method for integrating a beam splitter with an extractor faceplate of a Schottky TFE, the method comprising integrating a first end of a standoff to the extractor faceplate, forming holes in a microhole array plate, and mounting the microhole array plate to a second end of the standoff, wherein the second end is opposite the first end, where the standoff supports the microhole array plate above the extractor faceplate by a distance ranging from 0.5 mm to 2 mm.

A third embodiment describes a method for forming a plurality of electron beams, comprising providing power to a Schottky TFE to generate an electron beam at an extractor aperture, providing a voltage to an extractor contact and splitting the electron beam into a plurality of electron beams by passing the electron beam through a microhole array plate comprising a plurality of microholes, the microhole array plate being supported 0.5 mm to 2 mm above the extractor aperture by a standoff integrated with the extractor aperture.

The foregoing general description of the illustrative embodiments and the following detailed description thereof are merely exemplary aspects of the teachings of this disclosure, and are not restrictive.

BRIEF DESCRIPTION OF THE DRAWINGS

A more complete appreciation of the disclosure and many of the attendant advantages thereof will be readily obtained as the same becomes better understood by reference to the following detailed description when considered in connection with the accompanying drawings, wherein.

DETAILED DESCRIPTION

Referring now to the drawings, wherein like reference numerals designate identical or corresponding parts throughout the several views.

Devices, methods, and systems of the present disclosure describe the integration of a beam splitter microhole array with a Schottky TFE extractor electrode.

Aspects of the present disclosure describe a Schottky TFE with integrated beam splitter (IBS_TFE), which contains a beam splitter held apart from the top of the Schottky TFE extractor faceplate by a standoff. Electron microscopes using the IBS_TFE benefit in terms of improved resolution, image acquisition speed, and throughput (area scanned and imaged in unit time). The IBS_TFE may be used to generate a multi-beam source for multi-beam scanning electron microscopes and similar inspection tools.

The IBS_TFE generates a multi-beam source of electrons having high total beam current in multiple beams, along with low energy spread and trajectories displacement.

Figure 3:
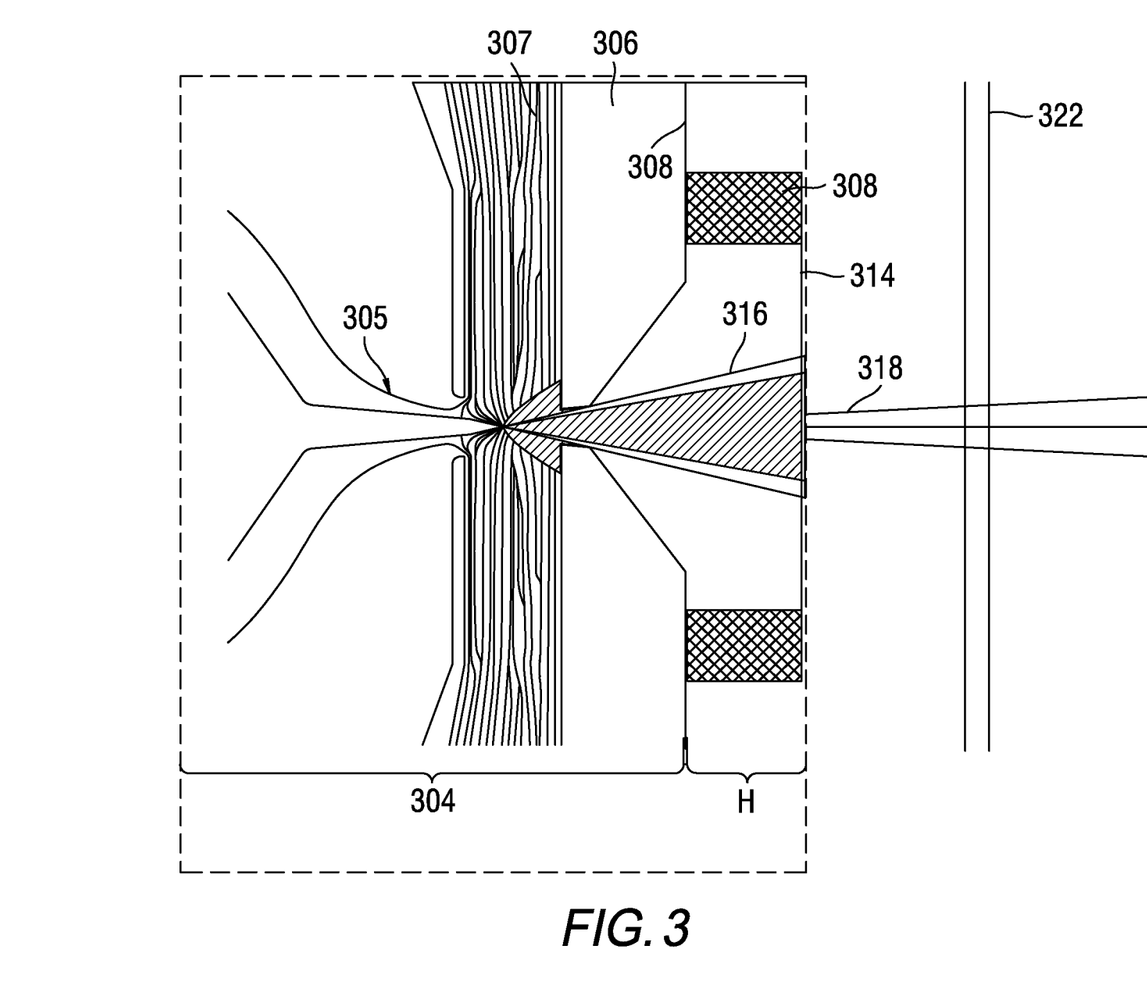
FIG. 3 is a schematic that shows a beam splitter integrated with the faceplate of the extractor of a Schottky TFE.

FIG. 3 is a schematic that shows the physical structure of an IBS_TFE 300. A Schottky TFE 304 includes a tip 305, a suppressor 307, an extractor 306 having a faceplate 308. The suppressor is an electrode internal to the Schottky TFE 304, which prevents stray thermionic emission from passing through the extractor bore and down the column. The tip 305 is centered in the suppressor 307. A beam 316 of electrons is generated at the tip 305. A beam splitter 314 having an array of microholes 415 (shown in FIG. 4) and its standoff 309 are mounted on the extractor faceplate 308. The beam splitter 314 and standoff 309 are axially aligned with the bore of the TFE extractor 306. A condenser lens 322 focuses the split beams 318 as they leave the beam splitter. In FIG. 3, the electronics and lenses that guide the split beams after they pass through the microholes of the beam splitter array onto the target are not shown for the sake of clarity.

In a non-limiting example, the potential difference between the extractor faceplate 308 and the beam splitter 314 may be approximately −100 volts, which adds a small amount of field focusing to the split beams 316. The IBS_TFE is integrated as a unit during the Schottky TFE manufacture. The microhole array of the beam splitter is provided with electrical voltage contacts for varying the electric voltage to achieve the highest beamlet current.

In a non-limiting example, the standoff 309 may hold the beam splitter 314 at a height, H, of 0.5 mm to 2 mm above the extractor. The standoff 309 may have a cylindrical or ring-shaped geometry with a diameter less than or equal to the diameter of the extractor. A typical commercial extractor faceplate outer diameter is about 12.5 mm, with central bore of 0.4 mm in diameter and approximately 1 mm in thickness. The standoff is a ring-shaped metal part aligned with extractor bore centerpoint. In a non-limiting example, the outer diameter of the ring is approximately 8 mm, has a width (from interior surface of the ring to the outer surface in the radial direction) of approximately 1 mm and a height of approximately 0.3 mm to 0.5 mm.

In an aspect of the present disclosure, the standoff 309 may be made of conductive material. A non-limiting example of the conductive material is a metal alloy, e.g., titanium-zirconium-molybdenum (TZM). TZM has a higher recrystallization temperature, higher creep strength, and higher tensile strength than pure, unalloyed molybdenum. TZM has a low thermal conductivity (0.48), and thus does not conduct heat from the extractor faceplate to the beam splitter. Excess heat at the beam splitter can cause the beam splitter to buckle, distorting the trajectories of the split beams. Additionally, the excess heat may cause the split beams to spread and/or interfere with each other after exiting the beam splitter, which decreases the amount of energy in the split beam which reaches the target.

In an aspect of the disclosure, the standoff may be made of a conductive, high resistance material, e.g., a resistive ceramic. In a non-limiting example, the resistive ceramic is alumina and may be similar to Kyocera AH100A, available from Kyocera International, 49070 Milmont Drive, Fremont, Calif., U.S.A. Resistive ceramics are manufactured from a sintered body of ceramic material, with conductive particles distributed throughout the matrix, to produce a resistor that is 100% active and non-inductive. Resistive ceramics are chemically inert. They can withstand high energy and high voltages at high temperatures, which is desirable for the standoff that is close to the TFE tip, which has a temperature on the order of 1800K. In using a high resistance ceramic, a potential difference is set up between the extractor and the beam splitter array, such that incident electrons intercepted by the beam splitter array render the splitter array negative with respect to the potential on the extractor. This benefits the IBS_TFE as splitter array holes become positive electrostatic micro-lenses, focusing incident electrons onto holes, thus additionally increasing thru-the-hole current.

Figure 4A:
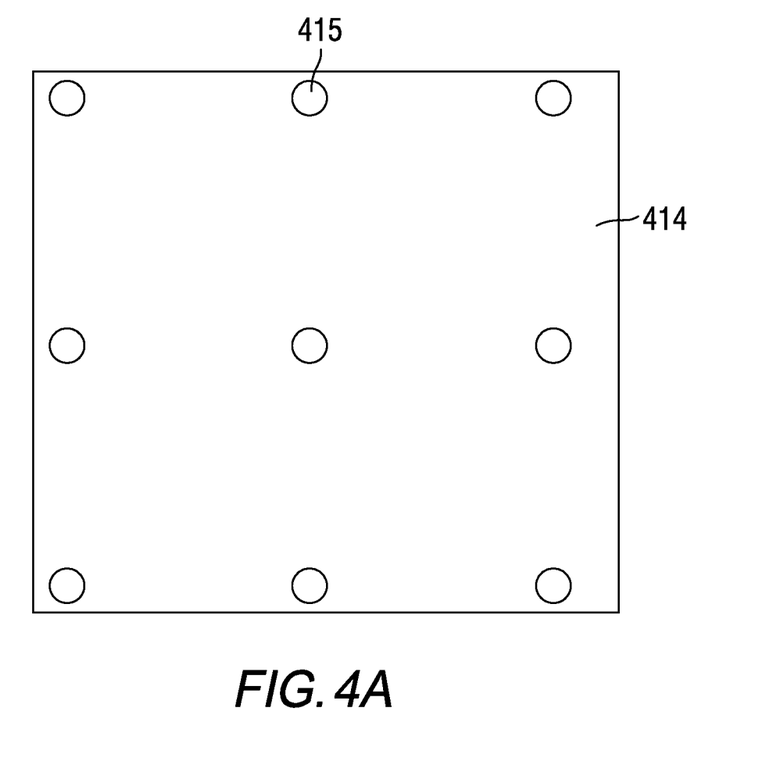
FIG. 4A is a schematic that shows a rectangular beam splitter array of microholes.

FIG. 4A is a schematic that illustrates one configuration of the beam splitter 414 of the IBS_TFE. The beam splitter 414 has a 3×3 array of microholes 415. The microholes are very precisely formed and are fabricated from a material that can withstand high temperatures without buckling or damage. In a non-limiting example, the diameter of the microholes ranges from 10 microns to 120 microns. The material of the microhole array may be the same material or a different material than the standoff. Microholes can be machined to a diameter as low as 10 microns in a TZM alloy sheet, which could increase the number of split beams exiting the array and reduce the final focused beamlet spot size, i.e., the SEM resolution. The size of the microholes depends on the current desired for each beamlet as it hits the target.

Figure 4B:
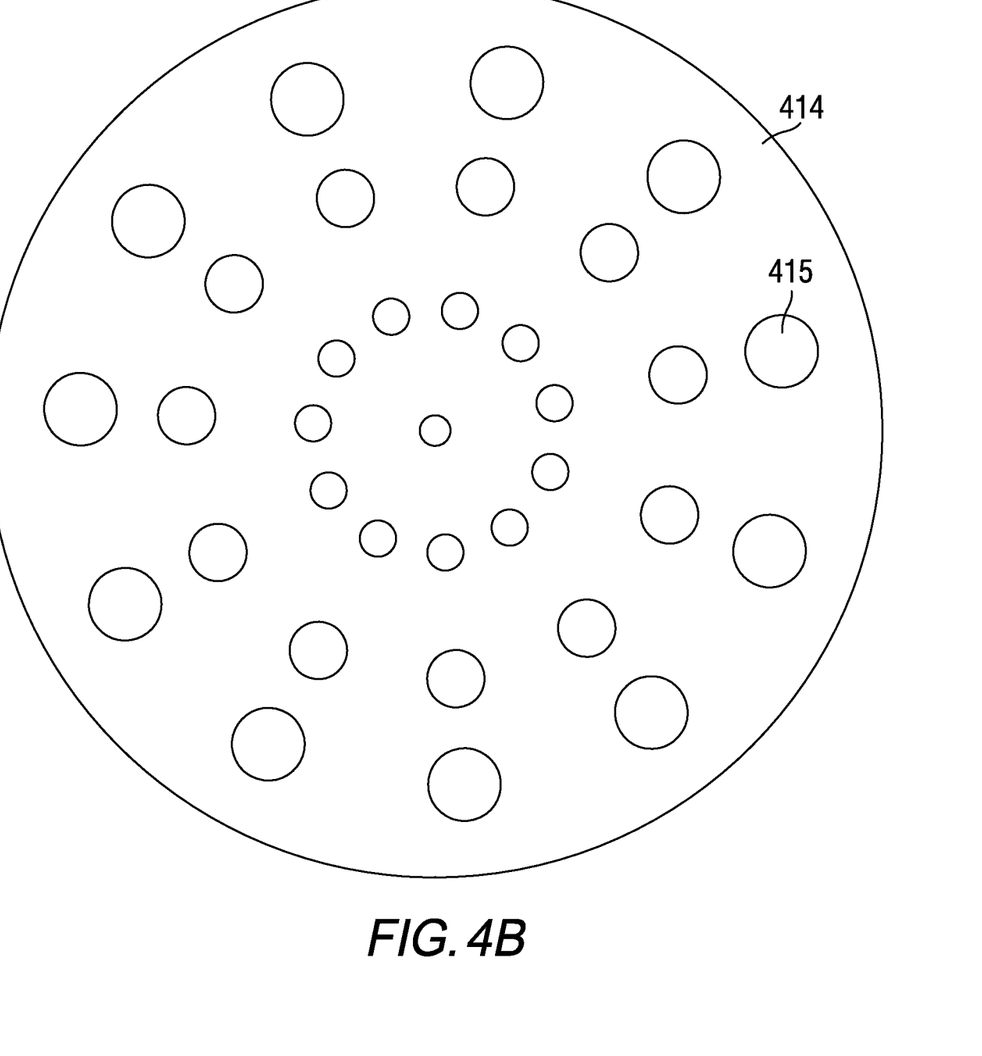
FIG. 4B is a schematic of a circular beam splitter having an array of equally spaced microholes in which the diameter of each microhole increases as its distance from the center increases.

FIG. 4B is a schematic which illustrates a second configuration of the beam splitter 414 showing a circular beam splitter array having a plurality of microholes which range from a small hole at the center through increasing sizes to large holes at the periphery. Although not shown, in an alternative, the plurality of microholes may range from a large hole at the center through decreasing sizes to small holes at the periphery.

Figure 4C:
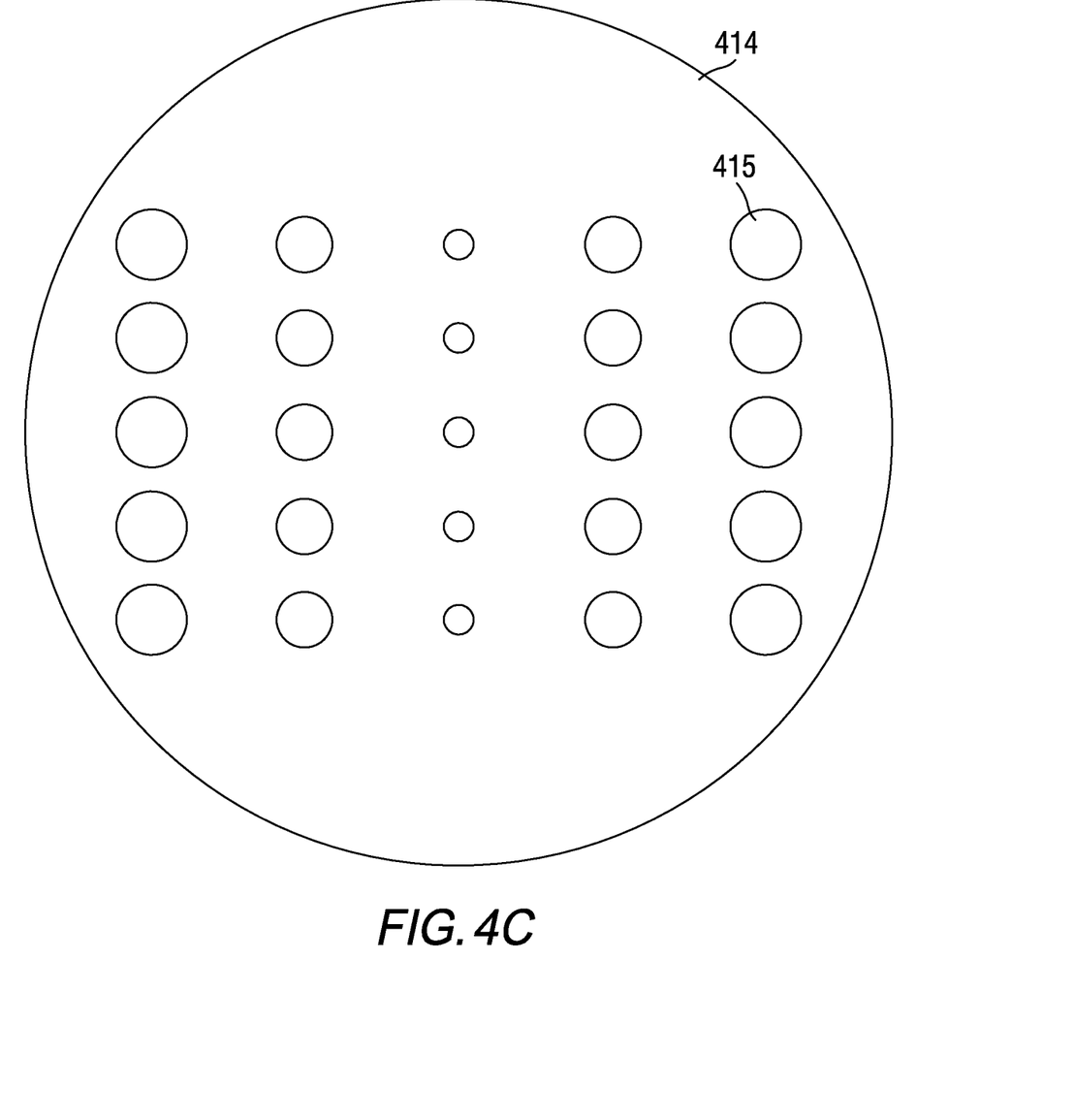
FIG. 4C is a schematic of a circular beam splitter having a rectangular 5×5 array of microholes which increase in diameter from the center to the periphery of the beam splitter.

FIG. 4C is a schematic which illustrates a third configuration of the beam splitter 414 in which the beam splitter is circular but the array is rectangular with progressively increasing hole sizes. The holes may range from 10 microns to 120 microns and are application specific. The rectangular array shown is a 5×5 array.

In a non-limiting example, the material of the beam splitter array may be stainless steel. In another non-limiting example, the material may be a TZM alloy. In an additional non-limiting example, the material may be a machinable conductive ceramic material.

Although FIG. 4A shows a 3×3 array of microholes 415, FIG. 4B shows a plurality of microholes and FIG. 4C shows a 5×5 array of microholes, the number of microholes, their diameters and array patterns are not limited. For example, a 4×4 array, a 4×5, a 5×5, or larger may be used, depending on the constraints of the optical column. The array may be a non-rectangular, application specific layout.

The split beams (318, FIG. 3) exiting the microhole array are beam-formed by downstream optics and electrodes to hit the target (not shown). A large number of simultaneously scanning split beams increases the SEM speed of acquisition, i.e., throughput. However, there is a limit to beamlet size in that, if a beamlet is too small, there may not be enough current in the beamlet to produce an SEM signal detectable given the noise level.

The beamlets 318 (split beams) exiting the microhole array carry lower current than the primary beam exiting the Schottky TFE by a factor proportional to the number of holes in the microhole array (array transparency). Separation of the beamlets lowers the Boersch effect in the individual beamlets, allowing for lower energy spread in each beamlet and thus lowering chromatic aberration.

Figure 5:
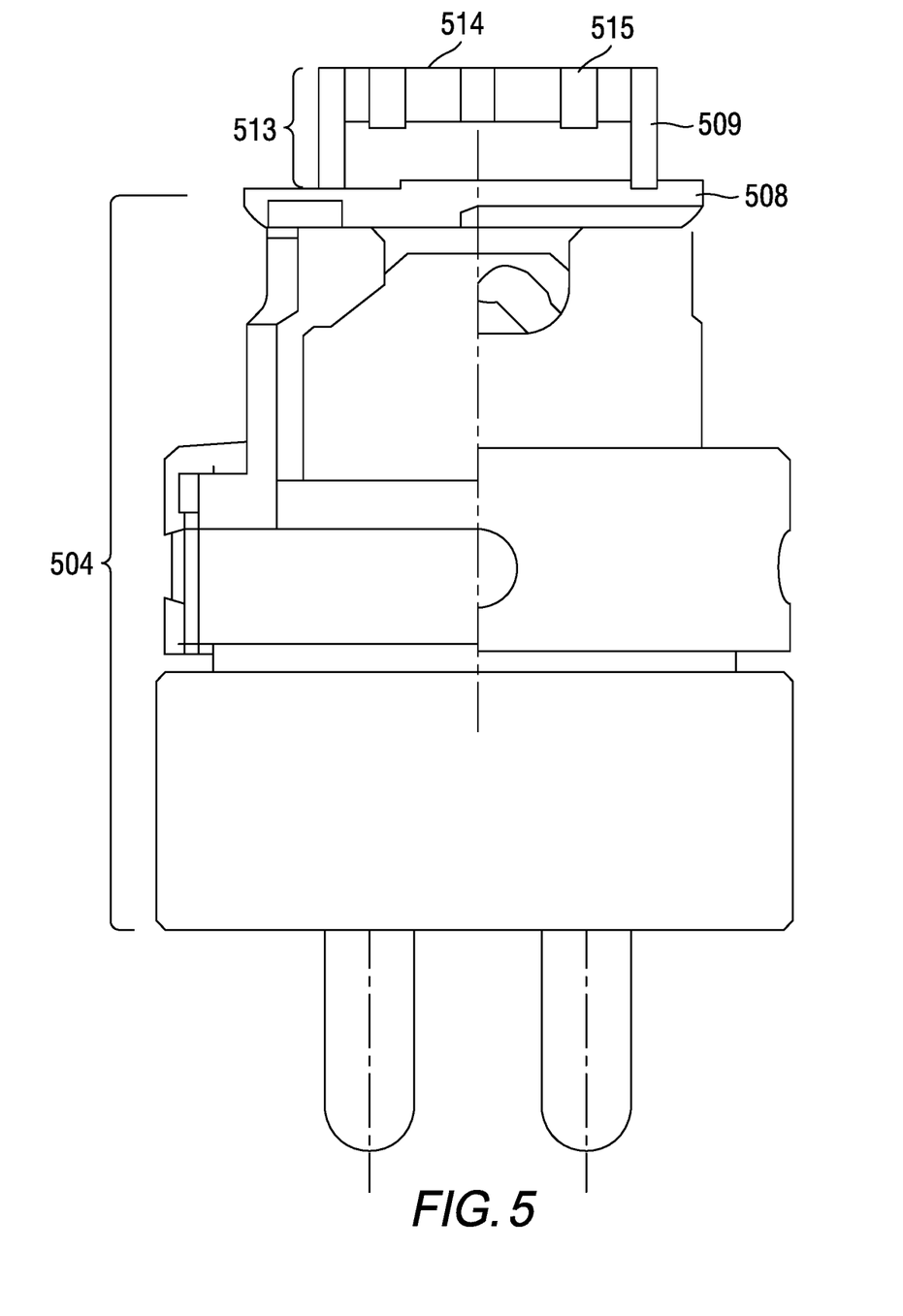
FIG. 5 is a schematic that shows a Schottky TFE with an integrated beam splitter and extractor.

FIG. 5 is a schematic that illustrates the integration of a Schottky TFE 504 with the IBS_TFE 513 of the present disclosure. The IBS_TFE 513 is integrated with the extractor surface 508 of the Schottky TFE 504. In an embodiment, the standoff 509 of the IBS_TFE 513 may be bonded to the extractor faceplate 508 by welding or brazing. In this embodiment, the standoff 509 may be a resistive ceramic, which creates a potential difference between the extractor faceplate and the microhole array. In another embodiment, the extractor faceplate 508 and standoffs 509 are machined from the same material, but as separate parts and joined later. The extractor and/or the standoff may be manufactured from a TZM alloy, titanium or stainless steel. In another embodiment, the standoff and beam splitter may be manufactured as one piece from the same piece of material, such as TZN alloy or titanium.

The IBS_TFE 513 of the present disclosure places the Schottky TFE-emitted beam in close proximity to the Schottky extractor electrode in order that maximum current passes thru the array of microholes.

Figure 6A:
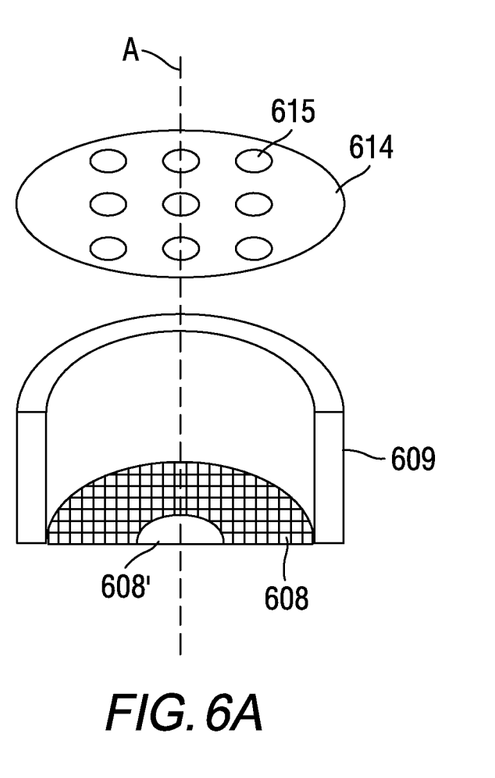
FIG. 6A is a schematic that shows the integration of the extractor faceplate, standoff, and beam splitter array in a cylindrical configuration.

FIG. 6A is a schematic that illustrates the integration of the Schottky TFE with the standoff 609. The standoff 609 is shown as a cross section of a hollow cylinder in FIG. 6A. The standoff 609 is shown integrated with the extractor faceplate 608 of the Schottky TFE. 608' represents the beam aperture in the center of the extractor 608. The standoff 609 and extractor faceplate may be integrated by welding or brazing. The beam splitter 614 microhole array includes an array of microholes 615 and is integrated with the top of the standoff 609 in line with axis A. The beam splitter microhole array plate may be welded or attached by brazing or welding to the top of the standoff 609, or may be formed as a single unit with the standoff 609.

Figure 6B:
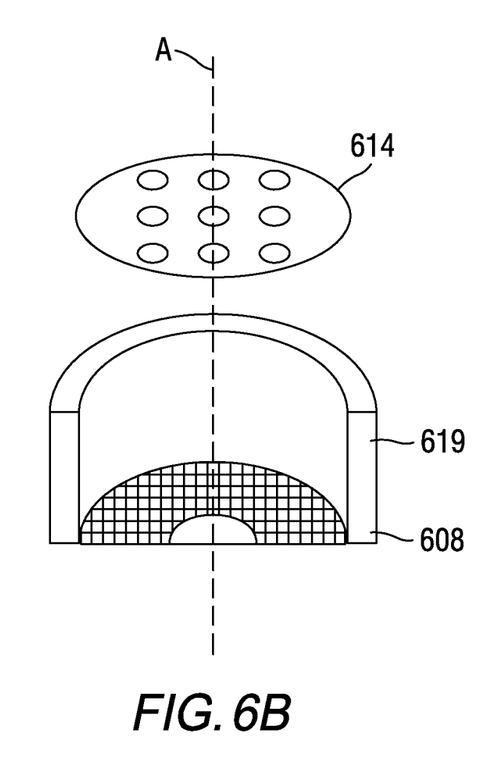
FIG. 6B is a schematic that shows a mounting feature for integrating the beam splitter array with the standoff.

FIG. 6B is a schematic that illustrates a mounting feature machined into the top portion of the standoff 609 to create an indented shelf 619. The beam splitter 614 microhole array rests upon the indented shelf 619 and can be secured by welding, friction stir welding, clamping, brazing, soldering with a high-temperature solder, or the like.

The standoff may be the same or a different material than the extractor faceplate. The standoff may be a metal alloy, e.g., TZM. If the extractor is a first material, e.g., stainless steel, and the standoff is a second high resistance material, e.g., resistive ceramic AH100A, then the potential on the extractor will be higher than the potential at the beam splitter due to the drop in potential across the standoff. This potential may provide a lensing effect on the beamlets (electrostatic focusing).

In operation, an incident electron beam is emitted by the Schottky TFE, which beam passes through the bore 608' (FIG. 6A) in the TFE extractor electrode, and immediately strikes the array of microholes located in close proximity to extractor electrode. The array is supported by the standoff, which provide for electrical and thermal contact between the microhole array and extractor electrode. The standoff may serve as a built-in resistor creating voltage bias between the beam splitter and the extractor. This voltage bias renders the beam splitter array microholes to be positive electrostatic microlenses, focusing incident electrons onto holes, and additionally increasing the thru-the-hole current.

The IBS_TFE of the present disclosure brings the beam splitter into close proximity with the Schottky emitter tip, integrating the beam splitter into the Schottky TFE. The benefits are that there is reduced energy spread, minimal trajectory displacement, and increased current in the plurality of individual beamlets (split beams).

An advantage of the IBS_TFE of the present disclosure over existing technology is that maximal current is provided to each individual beamlet, along with lowest possible energy spread and trajectories displacement in the plurality of beamlets, which is conducive to electron beam system focusing quality and resolution. Additionally, the focusing electrodes (e.g., 110, 112, FIG. 1) can be eliminated, as the beam spread is minimal.

An embodiment of the present disclosure describes a beam splitter integrated with an extractor faceplate of a Schottky TFE.

An embodiment of the present disclosure describes a beam splitter spaced apart from an extractor faceplate of a Schottky TFE by a standoff.

An embodiment of the present disclosure describes a beam splitter spaced apart from an extractor faceplate of a Schottky TFE by a standoff, wherein the standoff supports the beam splitter above the extractor by a distance of 0.5 mm to 2 mm.

An embodiment of the present disclosure describes a beam splitter spaced apart from an extractor faceplate of a Schottky TFE by a standoff, wherein the standoff has a hollow cylindrical geometry.

An embodiment of the present disclosure describes a beam splitter having an array of microholes.

An embodiment of the present disclosure describes a beam splitter having a 3×3 array of microholes.

An embodiment of the present disclosure describes a beam splitter having a 4×4 array of microholes.

An embodiment of the present disclosure describes a beam splitter having a 5×5 array of microholes.

An embodiment of the present disclosure describes a beam splitter including an array of microholes, wherein the diameter of each microhole ranges from 10 microns to 120 microns.

An embodiment of the present disclosure describes a beam splitter including an array of microholes, configured so that the diameter of the microholes increases from the center of the array to the periphery of the array.

An embodiment of the present disclosure describes a beam splitter including an array of microholes, configured so that the diameter of the microholes decreases from the center of the array to the periphery of the array.

An embodiment of the present disclosure describes a beam splitter including an array of microholes, wherein the diameters of the microholes vary from 10 microns to 120 microns, in a pattern in which the diameters are smaller toward the center of the array and larger near the periphery of the array.

An embodiment of the present disclosure describes a beam splitter array plate having a rectangular shape or a circular shape or a hexagonal shape.

An embodiment of the present disclosure describes a beam splitter array which is rectangularly shaped.

An embodiment of the present disclosure describes a beam splitter array which is circularly shaped.

An embodiment of the present disclosure describes a beam splitter array which is hexagonally shaped.

An embodiment of the present disclosure describes a beam splitter array which is octagonally shaped.

An embodiment of the present disclosure describes a beam splitter including an array of microholes wherein the diameter of each microhole ranges from 10 microns to 120 microns.

An embodiment of the present disclosure describes a beam splitter including an array of microholes, wherein the microholes are formed by micro-drilling.

An embodiment of the present disclosure describes a beam splitter including an array of microholes, wherein the beam splitter is fabricated from resistive machinable ceramic material and the microholes are formed by chemical etching.

An embodiment of the present disclosure describes a beam splitter integrated with a standoff and an extractor faceplate of a Schottky TFE.

An embodiment of the present disclosure describes a beam splitter integrated with standoff and an extractor faceplate of a Schottky TFE, wherein the beam splitter, standoff, and extractor faceplate are fabricated from stainless steel.

An embodiment of the present disclosure describes a beam splitter integrated with standoff and an extractor faceplate of a Schottky TFE, wherein the beam splitter, standoff, and extractor faceplate are fabricated from conductive ceramic material.

An embodiment of the present disclosure describes a beam splitter integrated with standoff and an extractor faceplate of a Schottky TFE, wherein the beam splitter, standoff, and extractor faceplate are fabricated from aluminum nitride or alumina.

An embodiment of the present disclosure describes a beam splitter integrated with a standoff and an extractor faceplate of a Schottky TFE, wherein the standoff is fabricated from a high-resistivity metal.

An embodiment of the present disclosure describes a beam splitter integrated with a standoff and an extractor faceplate of a Schottky TFE, wherein the beam splitter, standoff, and extractor faceplate are fabricated from tungsten carbide.

Embodiments of the present disclosure may also be as set forth in the following parentheticals.

(1) A beam splitter integrated with a thermal field emission (TFE) source comprising a Schottky TFE having an extractor faceplate, a standoff integrated with the extractor faceplate, and a microhole array integrated with the standoff and being disposed opposite the extractor faceplate, the microhole array having a plurality of microholes.

(2) The beam splitter of (1), wherein the extractor faceplate, the standoff and the microhole array are fabricated from a same material.

(3) The beam splitter of any one of (1) or (2), wherein the same material is titanium-zirconium-molybdenum, titanium or stainless steel.

(4) The beam splitter of any one of (1) to (3), wherein the same material is a machinable conductive ceramic material.

(5) The beam splitter one of (1) to (4), wherein the machinable conductive ceramic material is alumina.

(6) The beam splitter of (1), wherein the extractor faceplate, the standoff and the microhole array are fabricated from the same or different materials.

(7) The beam splitter of any one of (1) or (6), wherein the extractor faceplate is fabricated from stainless steel, the standoff is fabricated from a high resistance material and the microhole array is fabricated from a machinable ceramic material.

(8) The beam splitter of any one of (1) and (4) to (6), wherein the extractor faceplate is fabricated from stainless steel and the standoff and the microhole array are fabricated from a machinable conductive ceramic material.

(9) The beam splitter of any one of (1) and (4) to (7), wherein the machinable ceramic material is alumina.

(10) The beam splitter of (1), further comprising: a mounting feature located on a second end of the standoff, the mounting feature configured to connect the standoff to the microhole array.

(11) The beam splitter of (1), wherein the standoff separates the microhole array from the extractor faceplate by a distance ranging from 0.5 mm to 2 mm.

(12) The beam splitter of (1), wherein the microhole array is a 3×3 array, a 4×5 array or a 5×5 array.

(13) The beam splitter of (1), wherein each of the microholes has the same diameter, the diameter being from 10 microns to 120 microns.

(14) The beam splitter of (1), wherein the microholes increase in size from a center of the beam splitter to a periphery of the beam splitter.

(15) A method for integrating a beam splitter with an extractor faceplate of a Schottky TFE, the method comprising: integrating a first end of a standoff to the extractor faceplate; forming holes in a microhole array plate; mounting the microhole array plate to a second end of the standoff, wherein the second end is opposite the first end, and wherein the standoff supports the microhole array plate above the extractor faceplate by a distance of 0.5 mm to 2 mm.

(16) The method of (15), further comprising: integrating the first end of the standoff by welding the standoff to the extractor faceplate, or integrating the first end of the standoff by brazing the standoff to the extractor faceplate or, integrating the first end of the standoff by machining a groove on an interior of the first end of the standoff, inserting the extractor faceplate into the groove and welding the extractor faceplate to the standoff.

(17) The method of (15), further comprising: mounting the microhole array plate to the standoff by welding, or friction stir welding, or soldering, or clamping, or bonding with thermal adhesive.

(18) The method of (15), micro-drilling a plurality of microholes in the microhole array plate, wherein a diameter of the microholes increases from a center of the microhole array plate to a periphery of the microhole array plate.

(19) The method of (15), further comprising: forming holes in a microhole array plate by micro-machining, wherein micro-machining includes micro-drilling; or chemical etching.

(20) A method for forming multiple electron beams, comprising: providing power to a Schottky thermal field emission (TFE) to generate an electron beam at an extractor aperture; providing a voltage to an extractor contact and splitting the electron beam into a plurality of electron beams by passing the electron beam through a microhole array plate comprising a plurality of microholes, the microhole array plate being supported 0.5 mm to 2 mm above the extractor aperture by a standoff integrated with the extractor aperture.

Numerous modifications and variations of the present invention are possible in light of the above teachings. It is therefore to be understood that within the scope of the appended claims, the invention may be practiced otherwise than as specifically described herein.

The invention claimed is:

1. A beam splitter integrated with a Schottky thermal field emission (TFE) source, comprising:
a Schottky TFE having an extractor faceplate;
a standoff integrated with the extractor faceplate; and
a microhole array integrated with the standoff and being disposed opposite the extractor faceplate, the microhole array having a plurality of microholes.

2. The beam splitter of claim 1, wherein the extractor faceplate, the standoff, and the microhole array are fabricated from a same material.

3. The beam splitter of claim 2, wherein the same material is titanium-zirconium-molybdenum, titanium or stainless steel.

4. The beam splitter of claim 2, wherein the same material is a machinable conductive ceramic material.

5. The beam splitter of claim 4, wherein the machinable conductive ceramic material is alumina.

6. The beam splitter of claim 1, wherein the extractor faceplate, the standoff, and the microhole array are fabricated from the same or different materials.

7. The beam splitter of claim 6, wherein the extractor faceplate is fabricated from stainless steel, the standoff is fabricated from resistive material, and the microhole array is fabricated from a machinable ceramic material.

8. The beam splitter of claim 6, wherein the extractor faceplate is fabricated from stainless steel, and the standoff and the microhole array are fabricated from a machinable conductive ceramic material.

9. The beam splitter of claim 8, wherein the machinable ceramic material is alumina.

10. The beam splitter of claim 1, further comprising:
a mounting feature disposed on a second end of the standoff and being configured to connect the standoff to the microhole array.

11. The beam splitter of claim 1, wherein the standoff separates the microhole array from the extractor faceplate by 0.5 mm to 2 mm.

12. The beam splitter of claim 1, wherein the microhole array is a 3×3 array, or a 4×5 array, or a 5×5 array.

13. The beam splitter of claim 1, wherein each of the microholes in the microhole array has a same diameter, the diameter being from 10 microns to 120 microns.

14. The beam splitter of claim 1, wherein the microholes increase in size from a center of the beam splitter to a periphery of the beam splitter.

15. A method for integrating a beam splitter with an extractor faceplate of a Schottky TFE, the method comprising:
integrating a first end of a standoff to the extractor faceplate;
forming microholes in a microhole array plate; and
mounting the microhole array plate to a second end of the standoff,
wherein the second end is opposite the first end, and
wherein the standoff supports the microhole array plate above the extractor faceplate by a distance of 0.5 mm to 2 mm.

16. The method of claim 15, further comprising:
integrating the first end of the standoff by welding the standoff to the extractor faceplate, or
integrating the first end of the standoff by brazing the standoff to the extractor faceplate, or
integrating the first end of the standoff by machining a groove on an interior of the first end of the standoff, inserting the extractor faceplate into the groove, and welding the extractor faceplate to the standoff.

17. The method of claim 15, further comprising:
mounting the microhole array plate to the standoff by welding, or friction stir welding, or soldering, or clamping and bonding with thermal adhesive.

18. The method of claim 15, further comprising:
micro-drilling a plurality of microholes in the microhole array plate, wherein a diameter of the microholes increases from a center of the microhole array plate to a periphery of the microhole array plate.

19. The method of claim 15,
wherein the microholes in the microhole array plate are formed by micro-machining, and
wherein micro-machining includes micro-drilling or chemical etching.

20. A method for forming a plurality of electron beams, comprising:
providing power to a Schottky thermal field emitter (TFE) to generate an electron beam at an extractor aperture;
providing a voltage to an extractor contact; and
splitting the electron beam into a plurality of electron beams by passing the electron beam through a microhole array plate comprising a plurality of microholes, the microhole array plate being supported 0.5 mm to 2 mm above an extractor faceplate by a standoff integrated with the extractor faceplate.

* * * * *